(12) United States Patent
Luo et al.

(10) Patent No.: US 6,676,718 B2
(45) Date of Patent: *Jan. 13, 2004

(54) POLISHING OF SEMICONDUCTOR SUBSTRATES

(75) Inventors: Qiuliang Luo, Newbury Park, CA (US); Qianqiu Ye, Wilmington, DE (US); Kelly H. Block, Boothwyn, PA (US)

(73) Assignee: Rodel Holdings, Inc., Wilmington, DE (US)

( * ) Notice: Subject to any disclaimer, the term of this patent is extended or adjusted under 35 U.S.C. 154(b) by 83 days.

This patent is subject to a terminal disclaimer.

(21) Appl. No.: 10/005,253

(22) Filed: Dec. 4, 2001

(65) Prior Publication Data

US 2002/0132563 A1 Sep. 19, 2002

Related U.S. Application Data

(63) Continuation-in-part of application No. 09/759,583, filed on Jan. 12, 2001, now abandoned.

(51) Int. Cl.[7] .............................. C09G 1/02; C09G 1/04; H01L 21/321
(52) U.S. Cl. .............................. 51/307; 51/308; 51/309; 106/3; 438/692; 438/693
(58) Field of Search .......................... 51/307, 308, 309, 51/298; 106/3; 438/692, 693; 216/89, 100

(56) References Cited

U.S. PATENT DOCUMENTS

| | | |
|---|---|---|
| 4,867,757 A | 9/1989 | Payne |
| 5,614,444 A | 3/1997 | Farkas et al. |
| 5,676,587 A | 10/1997 | Landers et al. |
| 5,756,398 A | 5/1998 | Wang et al. |
| 5,876,490 A | 3/1999 | Ronay |
| 6,083,840 A | 7/2000 | Mravic |
| 6,524,168 B2 * | 2/2003 | Luo et al. ..................... 451/41 |

FOREIGN PATENT DOCUMENTS

| | | |
|---|---|---|
| EP | 0 373 501 A | 6/1990 |
| EP | 0 846 740 A | 6/1998 |
| EP | 1 152 046 A | 11/2001 |
| WO | 04 063428 A | 2/1992 |
| WO | WO 96 38262 A | 12/1996 |
| WO | WO 99 64527 A | 12/1999 |
| WO | WO 00 24842 A | 5/2000 |
| WO | WO 01 32794 A | 5/2001 |
| WO | WO 01 41973 A | 6/2001 |

OTHER PUBLICATIONS

Patent Abstracts of Japan, vol. 016, No. 271 (E–1218), Jun. 1992.

* cited by examiner

Primary Examiner—Michael Marcheschi
(74) Attorney, Agent, or Firm—Gerald K. Kita; Blake T. Biederman

(57) ABSTRACT

According to the invention, an aqueous polishing composition comprises, abrasive particles and water of basic pH to remove a barrier layer by CMP using a polishing pad, the aqueous polishing composition further comprising, solely polar molecules each having multiple, polar bonding sites forming respective hydrogen bonds with silanol bonding groups on a hydrated silica dielectric layer of a semiconductor substrate, which form an hydrophilic protective film of the polar molecules that minimizes erosion.

4 Claims, 1 Drawing Sheet

POLISHING OF SEMICONDUCTOR SUBSTRATES

CROSS REFERENCE TO RELATED APPLICATION

This application is a continuation in part of application Ser. No. 09/759,583 filed Jan. 12, 2001 abn.

FIELD OF THE INVENTION

The invention relates to removal of a barrier layer from an underlying dielectric layer on a semiconductor substrate by performing chemical mechanical polishing (CMP) of the semiconductor substrate.

BACKGROUND OF THE INVENTION

CMP is performed to remove a barrier layer from an underlying dielectric layer on a semiconductor substrate on which integrated circuits are constructed. Further, CMP is performed to provide the dielectric layer with a smooth, planar polished surface. The substrate to be polished is mounted on a carrier of a polishing machine. The carrier biases the substrate against the polishing pad while the substrate and the polishing pad undergo relative movement. A water based, aqueous polishing composition is applied at an interface of the substrate and the polishing pad.

U.S. Pat. No. 5,676,587 discloses removal of a liner film, referred to herein as a barrier layer, from an underlying dielectric layer, by performing CMP with a neutral pH, silica-based slurry. A slurry is an embodiment of an aqueous polishing composition. During CMP, the barrier layer is removed by abrasion applied by the polishing pad, and by chemical reaction of the barrier layer with the aqueous polishing composition, followed by dissolution in the aqueous polishing composition of the products of chemical reaction. Abrasion is applied by abrasive particles present in an embodiment of the polishing composition. While CMP is performed to remove a barrier layer from an underlying dielectric layer, the underlying dielectric layer undergoes unwanted erosion. Erosion refers to removal of the dielectric layer by the CMP operation. It is desirable to minimize erosion, while CMP is performed to remove a barrier layer from the dielectric layer. Alternatively, it is desirable to remove a controlled amount of the dielectric layer while CMP is performed to remove a barrier layer from the dielectric layer.

U.S. Pat. No. 5,614,444 discloses a slurry having molecules with at least one apolar component. The molecules bond with respective surface silanol bonding groups to form attached, apolar molecules, which apolar molecules are inherently hydrophobic to form a surface film that reduces erosion while CMP is performed.

SUMMARY OF THE INVENTION

According to the invention, an aqueous polishing composition has abrasive particles and water of basic pH to remove a barrier layer from a dielectric layer by CMP, and the aqueous polishing composition further comprises; solely polar molecules each having multiple, polar bonding sites forming bonds with bonding groups on a hydrated dielectric layer of a semiconductor substrate, to form an hydrophilic protective film of the polar molecules on the dielectric layer.

Embodiments of the invention will now be described by way of example with reference to the accompanying drawings.

DETAILED DESCRIPTION

Figure 1:
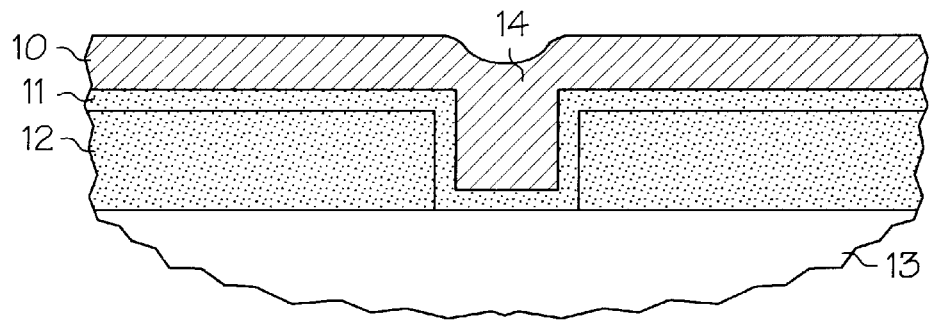
FIG. 1 is a cross section of a semiconductor substrate having a metal layer.
Figure 3:
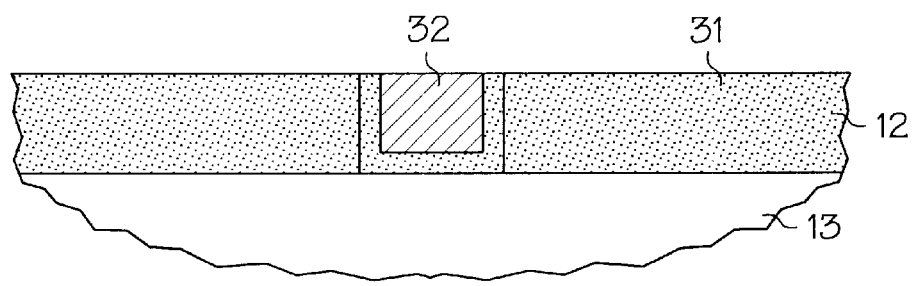
FIG. 3 is a view similar to FIG. 2, with the barrier layer removed from an underlying oxide layer or dielectric layer.

FIG. 1 discloses a semiconductor substrate having, a layer 10 of conductive material, metal, a barrier layer 11 and an underlying dielectric layer 12 on a substrate 13. The dielectric layer 12 has trenches 14, one shown, that are filled with the conductive material. The conductive material comprises, copper, tungsten or aluminum. FIG. 3 discloses that the barrier layer 11 lines the trenches to prevent migration of metal ions into the dielectric layer. The barrier layer 11 comprises, tantalum, tantalum nitride, titanium and/or titanium nitride or an alloy thereof. The dielectric layer comprises, a silicon oxide, for example, a silicon oxide derived from tetraethyl orthosilicate (TEOS).

Figure 2:
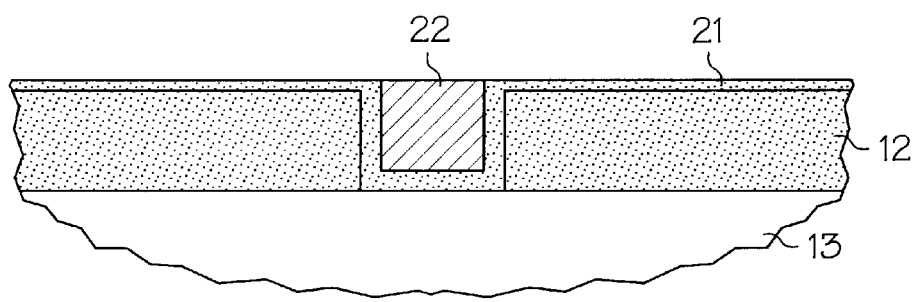
FIG. 2 is a view similar to FIG. 1, with the metal layer removed from an exposed barrier layer of the semiconductor substrate.

FIG. 2 discloses a semiconductor substrate of FIG. 1 with the conductive metal layer 10 of FIG. 1 removed, resulting in an exposed barrier layer 21 and a trench 22 filled with metal. The metal layer 10 is removed by a known CMP operation.

FIG. 3 discloses the semiconductor substrate after the barrier layer 21 has been selectively removed by CMP, to obtain a planar surface 31 on a dielectric layer, with minimized erosion, and with a trench 32 filled with metal.

With reference to FIG. 2, CMP is performed to selectively remove the barrier layer 21 from the underlying dielectric layer 12, while minimizing erosion of the dielectric layer 12 by CMP. An aqueous polishing composition that is sufficient for removal of Ta or TaN barrier layer 21 from the underlying dielectric layer 12 by polishing with a polishing pad and with the aqueous polishing composition, has, abrasive particles and water of basic pH.

According to an embodiment, the aqueous polishing composition contains abrasive particles at about 0.0001, 0.05, 0.1, 0.25, 0.5, 1, 2, 3, 4, 5, 10, 15, 20, 25, to 30% by weight. An embodiment of an aqueous polishing composition comprises substantially all abrasive particles having a mean size less than $5\mu$. Substantially all abrasive particles includes, 90, 91, 92, 93, 94, 95, 96, 97, 98, 99, 99.5, 99.9% of the particles. An embodiment of the abrasive particles comprises colloidal silica particles.

Alternatively, the aqueous polishing composition comprises, one or more of; a pH buffer, a surfactant, a deflocculant, a viscosity modifier, a wetting agent, a cleaning agent, and a biocide. An embodiment of the biocide comprises Neolone M50 available from Rohm and Haas Co., Philadelphia, Pa., with an active ingredient of 5-chloro-2-methyl-4-isothiazolin-3-one. According to the invention, the aqueous polishing composition further comprises, solely polar molecules each having multiple, polar bonding sites forming respective hydrogen bonds with silanol bonding groups on a hydrated silica dielectric layer of a semiconductor substrate, which form an hydrophilic protective film of the polar molecules. The solely polar molecules are hydrophilic. Solely polar is a terminology that refers to a molecule having multiple polar bonding sites without having an apolar bonding site.

According to an embodiment, the invention pertains to CMP of a substrate wherein the dielectric layer having the surface 31 is silicon dioxide. The silicon dioxide surface 31 is hydrated to have silanol and siloxane groups wherein the siloxane linkage (Si—O—Si) is formed by self condensation of silanol (Si—OH) groups. The silanol bonding groups are of high acidity, and tend to form hydrogen bonds with the solely polar molecules that have solely polar, hydrogen bonding sites, also known as, electron donor sites. The solely polar molecules have nitrogen atoms at nuclei of functional groups that are capable of forming intermolecular hydrogen bonds with silanol bonding groups on the surface 31 of the hydrated dielectric layer. Removal of the dielectric layer by CMP is suppressed by such polar molecules attached by formation of hydrogen bonds with respective silanol bonding groups on the hydrated surface 31 of the dielectric layer, which form an hydrophilic protective film on the surface 31 of the dielectric layer.

According to an embodiment, an aqueous polishing composition comprises, solely polar molecules forming bonds with bonding groups on the hydrated dielectric layer. According to an embodiment, the molecules are derived from a nitrogen-containing polymer compound, including but not limited to; polyacrylamide, polyvinylpyrrolidone, polyethyleneimine, and polyethyleneimine.

For example, polyethyleneimine molecules have nitrogen atoms at nuclei of bonding sites, the bonding sites forming intermolecular hydrogen bonds with respective silanol bonding groups on the surface of the dielectric layer, and forming a hydrophilic film that suppresses removal of the dielectric layer during the performance of CMP to remove the barrier layer. Polyethyleneimines have a general chemical structure:

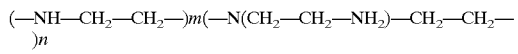

wherein m and n are integers that can be varied independently of each other, and with each having a value greater than or equal to 1.

Branched polyethyleneimines have a general chemical structure:

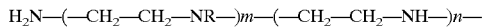

where R is (—CH2—CH2—N—) and m and n are greater than or equal to 1, respectively.

The multiple nitrogen atoms in respective solely polar molecules, such as molecules of polyethyleneimine, are at nuclei of respective sites for forming intermolecular hydrogen bonds with silanol bonding groups on the hydrated dielectric layer to result in a protective film of attached polar molecules, which enable controlled amounts of erosion, or which minimize erosion, of the dielectric layer during the performance of CMP to remove the barrier layer.

EXAMPLE 1

A neutral pH to basic pH, polishing composition according to the invention was used to polish semiconductor substrates having, copper in trenches; TEOS, a silicon dioxide dielectric layer; and a Tantalum barrier layer. An IPEC472 polisher was used with an aqueous polishing composition flow rate of 200 ml/min. Each formulation contained a biocide (Neolone M50 obtained from Rohm and Haas Company, Philadelphia, Pa.) at a concentration of about 0.01% by weight; Benzotriazole (BTA) at about 0.1% by weight as an inhibitor preventing dishing of metal in trenches; a surfactant onto copper at about 2% by weight; and colloidal silica particles known as Klebesol 1501-50 (obtained from Clariant Corp) at about 8.5% by weight of the polishing composition. The removal rates in Angstroms/minute were observed with polyethyleneimines, PEIs, at different weight concentrations of various average molecular weights, which are entered in the following table.

| Sample No. | PEI (800K) | PEI (50K) | PEI (750K) | pH | TEOS RR A/min | Ta RR A/min | Ta:TEOS Selectivity Ratio |
|---|---|---|---|---|---|---|---|
| 1 | — | — | — | 7 | 729 | 400 | 0.5:1 |
| 2 | — | — | — | 11 | 715 | 400 | 0.55:1 |
| 3 | 0.25 | — | — | 11 | 11 | 298 | 27.1:1 |
| 4 | — | 0.68 | — | 11 | 122 | 462 | 3.8:1 |
| 5 | — | 0.2 | — | 11 | 33 | 387 | 11.7:1 See Note (1), below |
| 6 | — | — | 0.2 | 11 | 50 | 200 | 4:1 |

Note (1): This data set was obtained using an AMAT Mirra Polishing Machine in place of an IPEC 472 polisher, with an IC1010 polishing pad (available from Rodel, Inc., Newark,Delaware) with a downforce of 3 psi, a carrier speed of 103 rpm, an aqueous polishing composition flow rate of 200 ml/min and a polishing time of 60 seconds.

A selectivity ratio comprises a ratio of barrier layer 21 removal rate to dielectric layer removal rate during CMP. The selectivity ratio is further referred to in the table, disclosed herein, by, Ta:TEOS selectivity ratio. The table indicates an unanticipated result that, when the average molecular weight of the solely polar molecules of polyethyleneimine increases to 800K from 750 K, the Ta:TEOS selectivity ratio increased from 4 to 27.1 (6.78 times) while the weight percent concentration of such molecules was substantially the same, as indicated in the table by a nominal amount of change from 0.2 to 0.25 weight percent concentration. Accordingly, minimized erosion corresponds with the high selectivity ratio, as provided by increasing the average molecular weight to at least 800K from lower levels of molecular weights.

A lower selectivity ratio is provided by lowering the average molecular weight from 800K to 750K. A lower selectivity ratio is provided by lowering the average molecular weight from 750K to 50K. Yet, to produce a selectivity ratio of 3.8, by molecules of 50K average molecular weight, requires a 0.68 weight percent concentration. A conclusion can be drawn that increases in selectivity ratio, corresponding with decreases in a rate of removal of the dielectric layer, are produced by increasing the average molecular weight of the molecules. Further, selecting the average molecular weight (for example, selecting a lower average molecular weight) adjusts the selectivity ratio (for example, adjusts the selectivity ratio lower), to remove a controlled amount of the dielectric layer, upon removal of the barrier layer 21 by CMP. Still further, selecting the concentration (for example, selecting a lower concentration) of the molecules adjusts the selectivity ratio (for example, adjusts the selectivity ratio lower), to remove a controlled amount of the dielectric layer, upon removal of the barrier layer 21 by CMP. The importance of adjusting the selectivity ratio will now be explained.

Sometimes the process of CMP, as described with reference to FIG. 2, removes copper in the trenches 22, producing a manufacturing effect known as dishing. Because of dishing, some of the copper in the trenches 22 has a lower elevation than the elevation of the dielectric layer 12. Such a manufacturing effect is reversed according to a feature of the invention. An aqueous polishing composition according to the invention adjusts the selectivity ratio toward lower numerical values, to purposely remove a controlled amount of the dielectric layer 12, when CMP is performed to remove the barrier layer 21. A controlled amount of the dielectric layer is removed, which lowers the elevation of the dielectric layer, until the dielectric layer becomes substantially coplanar with the copper in the trenches. A substantially coplanar dielectric layer and copper in trenches comprise a desirable manufacturing effect known as planarization. Planarization is sufficiently familiar, that chemical mechanical polishing, as described herein, is further known by an alternative terminology, chemical mechanical planarization.

According to an embodiment, the solely polar molecules are provided by a polymer compound comprising, polyethyleneimine (PEI) with an average molecular weight, in one of the following ranges, from about 100, 200, 500, 600, 700, 800, 900, 1000, 2000, 3000, 4000, 5000, 6000, 7000, 8000, 9000, 10,000, 20,000, 30,000, 40,000, 50,000, 100,000, 200,000, 300,000, 400,000, 500,000, 600,000, or 700,000, to about 1,000,000. Each of such ranges includes an advantageous range of molecular weights of at least 800K to optimize the selectivity ratio, Ta:TEOS, for minimizing erosion. Each of such ranges includes an advantageous range of molecular weights below 800K to adjust the selectivity ratio, Ta:TEOS, for removing a controlled amount of the dielectric layer.

According to an embodiment, the average molecular weight is obtained by a single average weight distribution of the solely polar molecules of polyethyleneimine. According to another embodiment, the average molecular weight is obtained by a mixture of polyethyleneimines of different molecular weights, which are mixed according to proportions that attain a desired average molecular weight. For example, the desired average molecular weight is obtained by a mixture of polyethyleneimines, of which, some comprise a first molecular weight distribution (e.g., a distribution in a range from about 100 to about 5,000), and some comprise at least one additional molecular weight distribution (e.g., a distribution in a range from about 5,000 to about 1,000,000).

An aqueous polishing composition has abrasive particles and water of basic pH to remove a barrier layer from a dielectric layer by CMP, and the aqueous polishing composition further comprises; solely polar molecules each having multiple, polar bonding sites forming bonds with bonding groups on a hydrated dielectric layer of a semiconductor substrate, to form an hydrophilic protective film of the polar molecules on the dielectric layer.

An aqueous polishing composition comprises, solely polar molecules forming bonds with bonding groups on the hydrated dielectric layer. According to an embodiment, the molecules are derived from a nitrogen-containing polymer compound, including but not limited to; polyacrylamide, polyvinylpyrrolidone, polyethyleneimine, and polyethyleneimine.

Embodiments of the invention have been disclosed, and other embodiments and modifications of the invention are intended to be covered by the spirit and scope of the appended claims.

What is claimed is:

1. An aqueous polishing composition comprising abrasive particles and water of basic pH to remove a barrier layer from a dielectric layer by chemical mechanical polishing, the aqueous polishing composition containing polyethyleneimine, the polyethyleneimine forming multiple polar bonding sites for forming bonds with bonding groups on a hydrated dielectric layer of a semiconductor substrate and for forming a hydrophilic protective film of the polyethyleneimine on the dielectric layer and the polyethyleneimine having a molecular weight of 50,000 to 1,000,000.

2. The aqueous polishing composition as recited in claim 1 wherein the polyethyleneimine has an average molecular weight of 800,000.

3. The aqueous polishing composition as recited in claim 1 wherein the dielectric layer is hydrated silica and the polyethyleneimine forms bonds through hydrogen and silanol bonding groups on the hydrated silica dielectric layer.

4. A method of adjusting a chemical mechanical polishing selectivity ratio of barrier layer removal rate to dielectric layer removal rate on a semiconductor wafer comprising the steps of:

providing the polishing composition of an aqueous polishing composition comprising abrasive particles and water of basic pH to remove a barrier layer from a dielectric layer by chemical mechanical polishing the aqueous polishing composition containing polyethyleneimine, the polyethyleneimine forming multiple polar bonding sites for forming bonds with bonding groups on a hydrated dielectric layer of a semiconductor substrate and for forming a hydrophilic protective film of the polyethyleneimine on the dielectric layer and the polyethyleneimine having a molecular weight of 50,000 to 1,000,000; and performing chemical mechanical polishing with the polishing composition and with a polishing pad to remove the barrier layer from the dielectric layer on a semiconductor wafer.

* * * * *